United States Patent [19]
Troue

[11] 3,983,385
[45] Sept. 28, 1976

[54] METHOD AND APPARATUS FOR OPERATING A MERCURY VAPOR LAMP

[75] Inventor: Harden Henry Troue, Plainfield, Ind.

[73] Assignee: Union Carbide Corporation, New York, N.Y.

[22] Filed: Nov. 17, 1975

[21] Appl. No.: 632,633

Related U.S. Application Data

[63] Continuation of Ser. No. 499,932, Aug. 23, 1974, abandoned.

[52] U.S. Cl. .................................. 240/47; 313/35; 313/43; 313/46; 355/67
[51] Int. Cl.² .......................................... H01J 61/52
[58] Field of Search ........................ 313/43, 35, 46; 240/11.2 R, 47, 11.4 R; 355/67

[56] References Cited
UNITED STATES PATENTS
2,924,731   2/1960   Martt et al. ............................ 313/43

FOREIGN PATENTS OR APPLICATIONS
465,137   5/1937   United Kingdom ................... 313/43

*Primary Examiner*—R. V. Rolinec
*Assistant Examiner*—Darwin R. Hostetter
*Attorney, Agent, or Firm*—Dominic J. Terminello

[57] ABSTRACT

A mercury vapor lamp is rendered substantially independent of the thermal environment by connecting each sealed end to a heat sink which is maintained at below 100°C and located sufficiently close to the sealed ends to hold the seal temperature to below 400°C.

6 Claims, 4 Drawing Figures

METHOD AND APPARATUS FOR OPERATING A MERCURY VAPOR LAMP

This application is a continuation of application Ser. No. 499,932, filed Aug. 23, 1974, now abandoned.

This invention relates in general to mercury vapor lamps for use in photocuring application.

BACKGROUND OF THE INVENTION

A significant improvement in photopolymerization processing is realized when the chemical coating to be cured is blanketed by an inert atmosphere during exposure to ultraviolet radiation. The principle source of ultraviolet energy is a conventional mercury vapor lamp. Mercury vapor lamps are relatively inexpensive and relatively efficient as generators of electromagnetic radiation in the ultraviolet wavelength range.

In order to simultaneously provide a protective atmosphere at the surface of the coating while the surface is undergoing irradiation, it is necessary to house the mercury lamps in a confined enclosure in common with the inerting assembly. However, when one or more mercury vapor lamps, particularly lamps of high wattage, are located in the confined enclosure of the inerting assembly, sufficient heat is radiated to cause the ambient temperature of the enclosure to rise considerably. The elevated thermal environment will in turn precipitate failure of the lamps. Such failure has been attributed to deterioration of the conducting elements within the lamps and more specifically to oxidation of the molybdenum strips which are sealed to the quartz envelop at the opposite ends of the lamp and extend internally of the lamp to the tungsten electrodes. Since the inerting assembly is designed to pass inert gas into the confined enclosure, it would be only natural to assume that the design can be modified so that the inert gas provides the additional function of cooling the ends of the mercury vapor lamps. This would then be analogous to other known mercury lamp systems which pass air over and around the ends of the mercury lamps to provide cooling. Nevertheless to provide adequate cooling in this manner requires not only a relatively large flow of gas but an indefinite flow which will vary with the number of lamps used and their wattage characteristic and may not necessarily provide uniform cooling. Hence, although feasible, it is not compatible with efficient inerting assembly design. Furthermore the requirement of high gas flow is a serious economic disadvantage which might prove fatal to the commercial viability of a photocuring system dependent upon such flow. In fact, considerable research effort has been expended to design an inert gas blanketing system as taught in U.S. Pat. No. 3,807,052 entitled Apparatus for Irradiation of a Moving Product in which the required inert atmosphere is satisfied using a very low flow of inert gas and is one of the principle reasons why photopolymerization in an inert atmosphere has become commercially acceptable. The aforementioned patent discloses an inerting assembly including an enclosure having a treatment chamber, which houses the source of radiation, such as a plurality of mercury vapor lamps, and an inlet and exit tunnel extending from the treating chamber. The disclosure teaches the importance of the geometry and location of the inert gas injector and its orientation within the assembly to achieve dynamic inerting at low flows and emphasizes the importance of a non-turbulent flow of inert gas throughout the enclosure.

It was theorized that the problem of overheating at the sealed ends of the lamp could be prevented from within the lamp by coupling the electrically conductive elements at the opposite ends of the lamp to a heat exchange medium external to the lamp. Although this coupling can be carried out in a number of ways the most preferred is through a direct conductive coupling. This technique permits the direct transfer of heat from the molybdenum elements most susceptible to oxidation deterioration when the lamp is operating within an elevated thermal environment without affecting the operating characteristics of the lamp. It has been shown that by conductive coupling in a predetermined manner not only is seal failure prevented but the lamp is rendered substantially independent of the external thermal environment.

SUMMARY OF THE INVENTION

In accordance with the present invention it was discovered that accelerated failure of a mercury vapor lamp due to its confinement in an optically enclosed space resulting in a high temperature environment can be overcome by conductively coupling the internal electrically conductive elements of the lamp to an externally located heat sink and controlling the temperature of the heat sink so as to maintain a "seal temperature" of below 400°C at the opposite ends of the lamp. The expression seal temperature is hereinafter defined as the temperature at the sealed interface between the molybdenum conductive strip and the surrounding quartz at the ends of the lamp.

Accordingly, one aspect of the present invention is directed to a method for continuously operating a high wattage mercury vapor lamp in a confined enclosure, with said lamp having an elongated quartz envelop sealed at each end; the improvement comprising the steps of:

connecting each sealed end of said lamp to a thermally conductive heat sink; maintaining said heat sink at a temperature of below 100°C; and locating said heat sink in such physical proximity to the sealed ends of said quartz envelop so that the seal temperature is held to below 400°C.

Another aspect of the present invention is directed to a method for continuously operating a plurality of high wattage mercury vapor lamps in combination as a source of ultraviolet radiation in a confined enclosure within which a non-turbulent inert gas atmosphere is maintained, each of said lamps having an elongated quartz envelop sealed at each end about an electrically conductive molybdenum strip; comprising the steps of:

connecting said electrically conductive molybdenum strip at the ends of each lamp in a series circuit relationship with a source of alternating current; intercoupling a thermally and electrically conductive heat sink into the series circuit of each lamp respectively;

maintaining the heat sink at a temperature of below about 100°C; and placing the heat sink in each circuit in such physical proximity to said sealed ends so that the temperature of the molybdenum strip at the sealed end of each lamp is maintained at below 400°C.

Yet another aspect of the present invention is directed to an improved mercury vapor lamp for generating ultraviolet light including an elongated quartz envelop surrounding two tungsten electrodes located at opposite ends of the envelop, with each end sealed in intimate contact about an electrically conductive molybdenum strip coupled to one of said electrode and an electrical conductor extending from each sealed end, the improvement comprising: terminal means located adjacent each opposite end of the envelop and being in electrical and thermal contact with each of said electrical conductors, means for electrically coupling said terminal means across a source of alternating current and means for passing a cooling liquid through said terminal means.

A further aspect of the present invention is directed to the combination of a mercury vapor lamp having an elongated quartz envelop surrounding two tungsten electrodes located at opposite ends of the envelop, with each end sealed in intimate contact about an electrically conductive molybdenum strip coupling one of said electrodes, and an electrical conductor extending from each sealed end, and a means for electrically coupling said conductor to a source of alternating current, said means being located adjacent a sealed end and being of relatively high thermal conductivity, and conduit means located contiguous to said coupling means and adapted for passage of a cooling liquid.

Accordingly, it is the sole object of the present invention to provide a mercury vapor lamp which can operate in an optically confined space substantially independent of its surrounding thermal environment.

Other advantages of the present invention will become apparent from the following detailed description of the preferred embodiment when taken in conjunction with the accompanying drawings realizing that variations and modifications may be made to the preferred embodiment without departing from the spirit and scope of the novel concept of the disclosure.

DETAILED DESCRIPTION OF THE INVENTION

Figure 1:
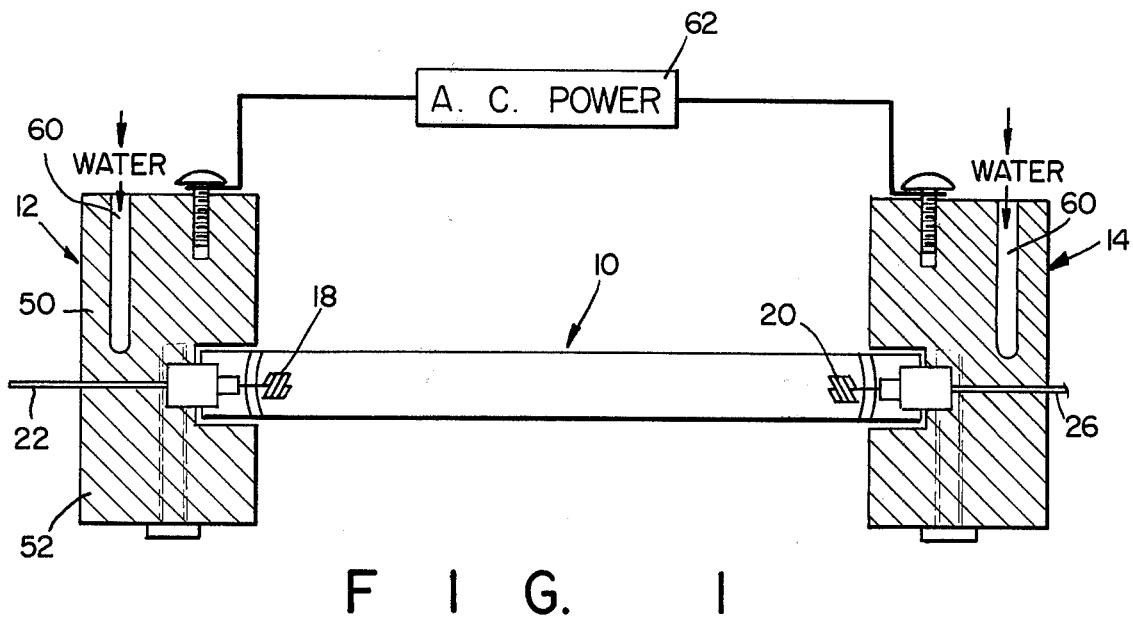
FIG. 1 is a longitudinal sectional view illustrating the combined mercury vapor lamp and terminal assembly of the present invention.
Figure 2:
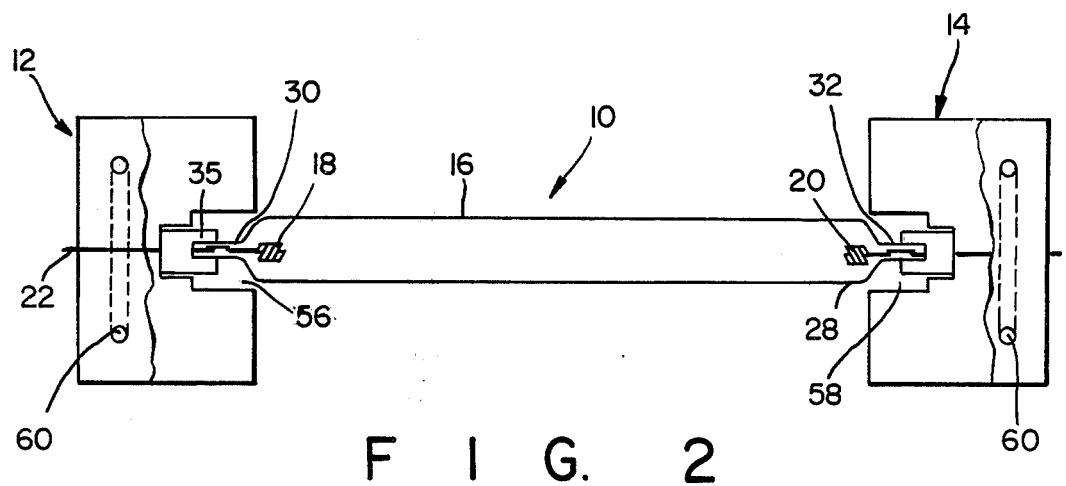
FIG. 2 is a similar view to that of FIG. 1 with the apparatus rotated (90° about a horizontal axis from the position shown in FIG. 1.

The apparatus of the present invention is shown in FIGS. 1 and 2 inclusive, and includes in combination a conventional mercury vapor lamp 10 and a pair of terminal assemblies 12 and 14 located adjacent each end of the lamp 10 respectively.

The mercury vapor lamp 10 is a typical commercially available 2.2 kw lamp manufactured by Sylvania Electric Products Inc. and commercially identified by the No. H2200T4/24Q. Although a medium pressure lamp of the particular configuration shown is illustrated in the drawings, the present invention is not to be construed as limited thereto. In fact, any conventional mercury vapor lamp may be used of any configuration and specification.

Figure 3:
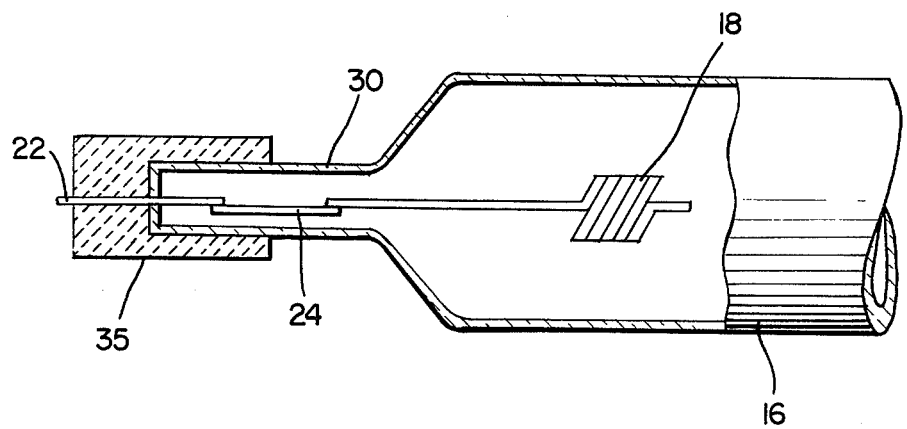
FIG. 3 is a substantially enlarged view of one of the sealed ends of the lamp shown in FIGS. 1 and 2.

The illustrated mercury vapor lamp 10 is sealed at each end 30 and 32 defining therebetween an arc envelop 16 of fused quartz which surrounds a pair of tungsten electrodes 18 and 20 located at the opposite ends of the lamp 10. The electrode 18 is connected at the sealed end 30 to the power conductor 22 through an intermediate strip of material 24. The sealed interconnection between the conducting elements consisting of the tungsten electrode 18, the intermediate strip 24, and the power lead 22 is shown more clearly in FIG. 3. Likewise, electrode 20 is connected at the sealed end 32 of lamp 10 to the power conductor 26 through an intermediate strip of material 28. Each strip of material 24 and 28 is composed of a ductile material which is electrically conductive and has a high melting point such as molybdenum. The sealed ends 30 and 32 are formed, after the lamp is filled with argon gas and a small amount of mercury, using conventional methods such as, for example, by mechanically compressing each end of the lamp 10 into intimate contact about the conducting strips 24 and 28 respectively. By compressing the ends together to form a seal, the end geometry becomes substantially rectangular. Alternatively, the ends of the lamp 10 may be vacuum drawn forming an extended neck which intimately encloses the molybdenum strips. It is also conventional to encapsulate the sealed ends 30 and 32 respectively in ceramic material 35. Moreover, a metallic conductive cap may be placed over the sealed ends 30 and 32 of lamp 10 and used as a substitute for the external power leads 22 and 26 respectively.

The terminal assemblies 12 and 14, shown in FIGS. 1 and 2 inclusive, are preferably identical in structure with each essentially represented by a member shown in the form of a block which is thermally and preferably electrically coupled to the molybdenum strips 24 and 28 respectively of lamp 10. The terminal assemblies 12 and 14 although primarily intended as heat sinks also function to shield the sealed ends 30 and 32 from radiation as will be explained in more detail hereafter as well as to transmit the alternating current to the tungsten electrodes 18 and 20.

The physical configuration and materials of construction for each terminal assembly 12 and 14 is not critical to the invention provided they adequately perform the function of a heat sink so as to drive sufficient heat from the internal conductive elements of the lamp 10, and more particularly from the molybdenum strips 24 and 28, to prevent failure. To fulfill this requirement each terminal assembly must be constructed of a reasonably good thermally conductive material and be of a configuration so as to permit efficient transfer of heat. It is particularly preferred to use the power conductors 22 and 26 to function as the intermediate heat transfer medium from the molybdenum strips 24 and 28 to the terminal assemblies 12 and 14 respectively. The physical placement of each terminal assembly 12 and 14 to each sealed end 30 and 32 respectively of lamp 10 is critical in that if there is too far a separation the necessary cooling to overcome oxidation at the sealed ends will not be achieved. It has been found that the location of the terminal assemblies 12 and 14 must be in such close proximity to the sealed ends 30 and 32 to keep the seal temperature below 400°C and preferably not above 350°C. To maintain the seal temperature at this level it has also been found necessary to insure that the temperature of the terminal assemblies 12 and 14 be held to a temperature significantly lower than 350°C and preferably not above about 100°C. To satisfy the latter requirement the terminal assemblies 12 and 14 must be cooled with a cooling liquid such as water. The extent of such cooling will determine the heat driving force.

The preferred structural arrangement for each terminal assembly 12 and 14 as shown in FIGS. 1 and 2 comprises a two section construction with each section 50 and 52 respectively composed of a material which is thermally and preferably electrically conductive such as copper or aluminum. The two sections 50 and 52 are intended to be coupled by bolts 54 so as to fit about an end of the lamp 10. Each section 50 and 52 includes drillings for forming, when the two sections are combined, two concentrically recessed portions 56 and 58, into which the ceramic covering 35 at each sealed end 30 and 32 of lamp 10 is seated before firmly securing the sections, and a bore through which the power conductor at each end is entrained. It is also desirable to hold a fairly close tolerance in order to achieve good surface contact, between the sealed ends 30 and 32, at their terminations with the power conductors 22 and 26 respectively, and the sections 50 and 52 of each terminal assembly 12 and 14 respectively. A passageway 60 is located in the upper section of each assembly for passing the cooling water from a source (not shown) through each terminal assembly. The passageway 60 should be located sufficiently close to the conducting power leads 22 and 26 to maintain an effective heat transfer gradient between the conductive strips 24 and 28 and the terminal assemblies.

AC power is applied to the lamp 10 from a source 62 connected across the terminal assemblies 12 and 14. Alternatively, AC power may be applied directly across the power conductors 22 and 26 in which case the terminal assemblies need not be electrically conductive.

The recessed portions 56 and 58 into which the sealed ends of the lamp are seated are preferably of a length sufficient to form a radiation shield about the molybdenum strips 24 and 28 respectively. Shielding the molybdenum strips from reflective radiation limits the extent of internal cooling of the lamp 10 that would otherwise be necessary to maintain the seal temperature at below 400°C.

Figure 4:
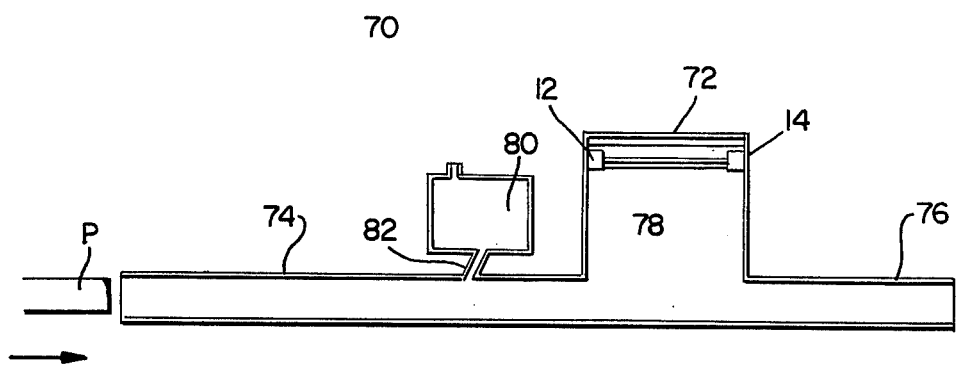
FIG. 4 is a diagrammatic illustration of the preferred inerting apparatus housing the mercury vapor lamp and terminal assembly shown in FIGS. 1 and 2.

The preferred system in which a plurality of lamps 10 are used as a source of ultraviolet radiation in an inert enclosure is schematically illustrated in FIG. 4. A product P is intended to pass through the inert enclosure 70 at a predetermined speed. The enclosure 70 includes a radiation chamber 72 which houses a plurality of lamps 10, only one of which is shown, and an inlet and exit tunnel 74 and 76 respectively. Each lamp 10 is seated as shown in FIG. 1 in a terminal assembly 12 and 14 respectively which is in turn affixed to the chamber 72. A reflector 78 partially covers the lamp 10 for redirecting radiated light toward the passing product P. The cooling water passing through the terminal assemblies 12 and 14 may also be used to cool the reflector 78. The atmosphere within the enclosure 70 is exclusively controlled by the passage of inert gas fed from the plenum chamber 80 through the inert gas injector 82 into the enclosure 70. The method by which the inert gas may be fed at a predetermined low flow rate to maintain an inert atmosphere above the moving product is taught in U.S. patent application Ser. No. 461,378 filed on Apr. 16, 1974 and entitled Method Of Inerting The Atmosphere Above A Moving Product. A non-turbulent flow of inert gas is maintained throughout the enclosure.

By following the teachings of the present invention so as to conductively transfer heat out from the electrically conducting elements within each of the lamps 10 a substantial degree of thermal independence is achieved between each of the lamps 10 and the ambient temperature within the optically enclosed radiation chamber 72.

What is claimed is:

1. A method for continuously operating at least one mercury vapor UV lamp in any gaseous environment existing in a confined optical enclosure; said lamp consisting of a single elongated quartz envelope, a quartz to metal seal at each end and an exposed terminal at each end; the improvement comprising the steps of:
   a. providing at least one thermally conductive heat sink independent of said lamp and locating said heat sink so that it does not contact said single elongated quartz envelope;
   b. mechanically connecting only each exposed terminal of said lamp to said thermally conductive heat sink;
   c. maintaining said heat sink at a temperature below 100°C by passing a cooling liquid therethrough;
   d. and locating said heat sink in such close physical proximity to said quartz to metal seal so that the seal temperature is held below 400°C.

2. A method according to claim 1 wherein the cooling liquid is water.

3. A method as defined in claim 1 wherein heat sink is composed of material selected from the class consisting of copper, aluminum and alloys thereof.

4. Apparatus for photopolymerizing chemical coatings comprising an enclosure having a radiation chamber therein; an inlet tunnel to said radiation chamber and an outlet tunnel from said radiation chamber; a plurality of terminal assemblies mounted in said radiation chamber; a plurality of mercury vapor lamps having sealed ends and exposed power terminals mounted in said terminal assemblies so that the exposed power terminals only are connected to the terminal assembly; each of said terminal assemblies having water passages therein for carrying cooling water sufficiently close to the power terminals of said mercury vapor lamp to keep said sealed ends below a temperature of 400°C.

5. Apparatus according to claim 4 including a plenam chamber communicating with said inlet tunnel through a gas injector for maintaining a non-turbulent flow of inert gas throughout said enclosure.

6. In a mercury vapor lamp for generating ultraviolet light consisting of a single elongated quartz envelope surrounding two tungsten electrodes located at opposite ends of the envelope, a quartz to metal seal at each end and an exposed terminal at each end, the improvement comprising: terminal means located adjacent each opposite end of said envelope in close physical proximity thereto but in contact only with said exposed terminal; means for electrically coupling said terminal means across a source of alternating current and means for passing a cooling liquid through said terminal means at a predetermined rate so that the temperature of the molybdenum strip is held below 400°C.

* * * * *

UNITED STATES PATENT OFFICE
CERTIFICATE OF CORRECTION

Patent No. 3,983,385　　　　　Dated September 28, 1976

Inventor(s) Harden Henry Troue

It is certified that error appears in the above-identified patent and that said Letters Patent are hereby corrected as shown below:

Column 6, line 31, after "wherein", insert --the--;

line 47, change "plenam" to --plenum--.

Signed and Sealed this thirtieth Day of August 1977

[SEAL]

Attest:

RUTH C. MASON　　　　　　　　　C. MARSHALL DANN
*Attesting Officer*　　　　　　*Commissioner of Patents and Trademarks*

UNITED STATES PATENT OFFICE
CERTIFICATE OF CORRECTION

Patent No. 3,983,385  Dated September 28, 1976

Inventor(s) H. H. Troue

It is certified that error appears in the above-identified patent and that said Letters Patent are hereby corrected as shown below:

Column 6, line 55, after "end", insert --, said metal in the quartz to metal seal comprising a molybdenum strip--.

Signed and Sealed this

Twenty-fifth Day of October 1977

[SEAL]

Attest:

RUTH C. MASON
*Attesting Officer*

LUTRELLE F. PARKER
*Acting Commissioner of Patents and Trademarks*